United States Patent
Li

(10) Patent No.: US 9,210,811 B2
(45) Date of Patent: Dec. 8, 2015

(54) COMPACT RIGID-FLEXIBLE PRINTED CIRCUIT BOARD AND METHOD FOR MANUFACTURING SAME

(71) Applicants: FuKui Precision Component (Shenzhen) Co., Ltd., Shenzhen (CN); Zhen Ding Technology Co., Ltd., Tayuan, Taoyuan (TW)

(72) Inventor: Biao Li, Shenzhen (CN)

(73) Assignees: FuKui Precision Component (Shenzhen) Co., Ltd., Shenzhen (CN); Zhen Ding Technology Co., Ltd., Tayuan (TW)

( * ) Notice: Subject to any disclaimer, the term of this patent is extended or adjusted under 35 U.S.C. 154(b) by 118 days.

(21) Appl. No.: 14/095,878

(22) Filed: Dec. 3, 2013

(65) Prior Publication Data
US 2014/0305683 A1    Oct. 16, 2014

(30) Foreign Application Priority Data
Apr. 11, 2013  (CN) .................. 2013 1 01244808

(51) Int. Cl.
| | |
|---|---|
| H05K 1/00 | (2006.01) |
| H05K 1/14 | (2006.01) |
| H05K 3/36 | (2006.01) |
| H05K 3/46 | (2006.01) |

(52) U.S. Cl.
CPC .................. H05K 1/14 (2013.01); H05K 3/361 (2013.01); H05K 3/4691 (2013.01); *H05K 2201/0909* (2013.01); *H05K 2201/09109* (2013.01); *H05K 2201/09127* (2013.01); *Y10T 29/302* (2015.01)

(58) Field of Classification Search
USPC ............ 174/245, 260, 264, 545; 29/830, 255, 29/847; 156/250, 253, 257; 438/128; 428/131, 220, 458, 626
See application file for complete search history.

(56) References Cited

U.S. PATENT DOCUMENTS 4,872,934 A * 10/1989 Kameda ................... 156/250
2008/0172867 A1* 7/2008 Tsurusaki et al. ............ 29/830

FOREIGN PATENT DOCUMENTS

| TW | 200936008 A | 8/2009 |
|---|---|---|
| TW | 200952582 A | 12/2009 |
| TW | 201129276 A | 8/2011 |

* cited by examiner

*Primary Examiner* — Xiaoliang Chen
(74) *Attorney, Agent, or Firm* — Novak Druce Connolly Bove + Quigg LLP

(57) ABSTRACT

A compact rigid-flexible board includes two flexible PCBs, two rigid substrates, a third trace layer and a fourth trace layer. The first flexible PCB includes a first depressing portion, a first exposed portion and a third depressing portion, and a separated second exposed portion. The second flexible PCB includes fourth and fifth depressing portions, and a second exposed portion. The first rigid substrate includes sixth, seventh, and eighth depressing portions. The second rigid substrate includes ninth and tenth depressing portions. The third trace layer, the sixth, first, fourth, and ninth depressing portions and the fourth trace layer are stacked in sequence. The third trace layer, the seven, second, fifth, and tenth depressing portions, and the fourth trace layer are stacked in sequence. The third trace layer and the eighth and third depressing portions are stacked in sequence.

6 Claims, 25 Drawing Sheets

COMPACT RIGID-FLEXIBLE PRINTED CIRCUIT BOARD AND METHOD FOR MANUFACTURING SAME

BACKGROUND

1. Technical Field

The present disclosure relates to a printed circuit board (PCB), especially to a rigid-flexible PCB and a manufacturing method for the rigid-flexible PCB.

2. Description of Related Art

Rigid-flexible PCBs includes flexible PCBs and rigid PCBs electrically connected to each other and such double-function PCBs are used in electronic devices. In recent years, as electronic devices become more and more compact, there is a need for reducing the volume of the rigid-flexible PCB.

Therefore, it is desirable to provide a smaller compact rigid-flexible PCB.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Referring to FIGS. 1 to 15, a method for manufacturing a rigid-flexible PCB according to a first embodiment is disclosed. The method includes steps as follows.

Figure 1:
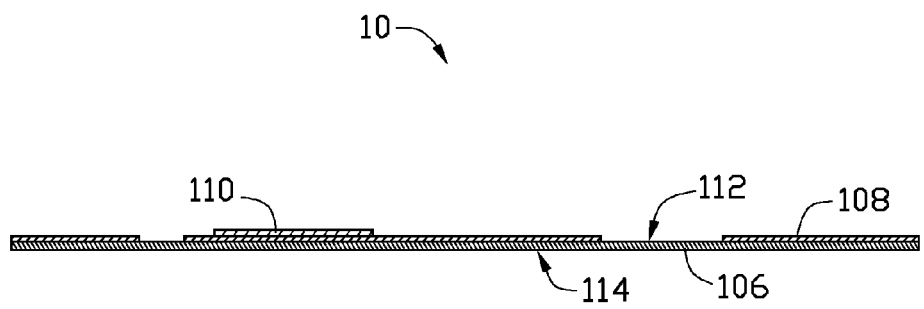
FIG. 1 is a sectional view of a first flexible PCB according to a first embodiment of the present disclosure.
Figure 2:
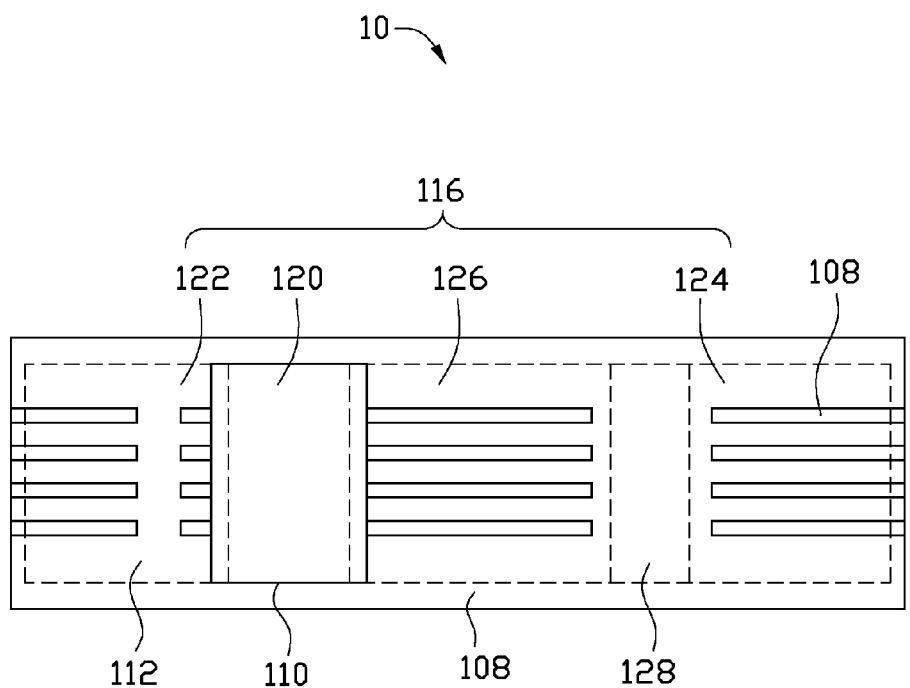
FIG. 2 is a top view of the first flexible PCB of FIG. 1.
Figure 3:
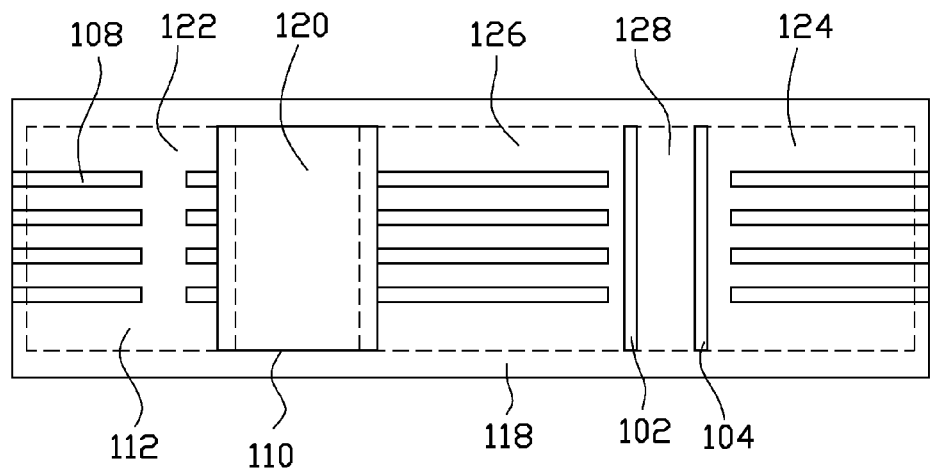
FIG. 3 is similar to FIG. 2, except that pre-cut holes are defined on the first flexible PCB.

In step 1, referring to FIGS. 1 to 3, a first flexible PCB 10 is provided. The first flexible PCB 10 has a first pre-cut hole 102 and a second pre-cut hole 104.

Referring to FIGS. 1 and 2, the first flexible PCB 10 is a single-sided PCB, and includes a first substrate 106, a first trace layer 108 formed on the surface of the substrate 106, and a first cover film 110 formed on parts of the first trace layer 108. The substrate 106 is made of flexible resin, such as polyimide (PI), polyethylene terephthalate (PET), and polythylene naphthalate (PEN). The first substrate 106 includes a first surface 112 and a second surface 114 opposite to the first surface 112. The first trace layer 108 is formed on the first surface 112. The first trace layer 108 is a copper layer processed by a selective corrosion process.

The first flexible PCB 10 includes a first product portion 116, a second unwanted portion 118, and a first unwanted portion 128. The first product portion 116 includes a first exposed portion 120, a first depressing portion 122, a second depressing portion 124, and a third depressing portion 126. The first depressing portion 122 is adjacent to a side of the first exposed portion 120. The second depressing portion 124 and the third depressing portion 126 are adjacent to an opposite side of the first exposed portion 120. The third depressing portion 126 is located between the first exposed portion 120 and the second depressing portion 124 and connects to the first exposed portion 120. The first unwanted portion 128 is located between the second depressing portion 124 and the third depressing portion 126 and connects to the second depressing portion 124 and the third depressing portion 126. The second unwanted portion 118 is adjacent to the periphery of the first depressing portion 122, the first exposed portion 120, the third depressing portion 126, the first unwanted portion 128, and the second depression portion 124. Referring to FIGS. 2 and 3, the above mentioned portions are each shown as divided by dashed lines.

The second unwanted portion 118 and the first unwanted portion 128 are used to protect the first exposed portion 120, the first depressing portion 122, the second depressing portion 124, and the third depressing portion 126 during the process of manufacturing the rigid-flexible PCB, and are removed after the process is finished.

The first exposed portion 120 forms a bend portion of the rigid-flexible PCB. The first depressing portion 122, the second depressing portion 124, and the third depressing portion 126 are fixedly connected to a rigid PCB. Each of the first exposed portion 120, the first depressing portion 122, the second depressing portion 124, and the third depressing portion 126 includes the first trace layer 108. The first cover film 110 covers the whole first exposed portion 120 and parts of the first depressing portion 122 and the third depressing portion 126 adjacent to the first exposed portion 120. The first cover film 110 is a solder mask.

The first unwanted portion 128 includes the first pre-cut hole 102 and the second pre-cut hole 104. The first pre-cut hole 102 extends along the boundaries of the third depressing portion 126 and the first unwanted portion 128. The second pre-cut hole 104 extends along a boundary between the first unwanted portion 128 and the second depressing portion 124. Two ends of both the first pre-cut hole 102 and the second pre-cut hole 104 are adjacent to the second unwanted portion 118.

In other embodiments, the first cover film 110 covers the first exposed portion 120 entirely.

Figure 4:
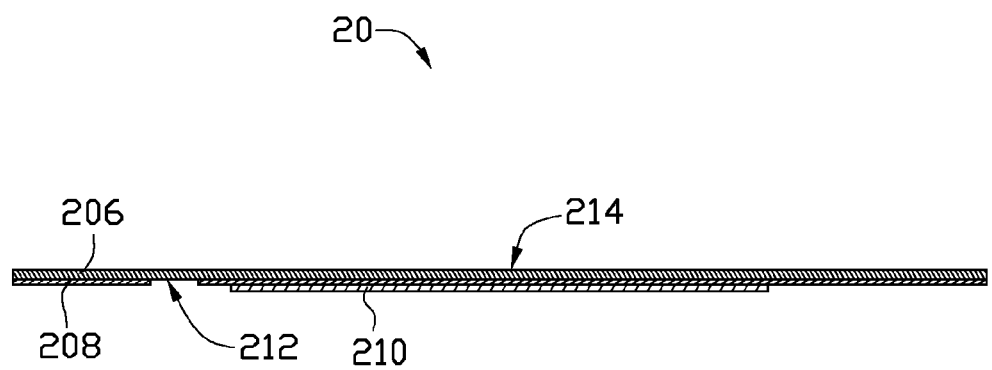
FIG. 4 is a sectional view of a second flexible PCB according to a first embodiment of the present disclosure.
Figure 5:
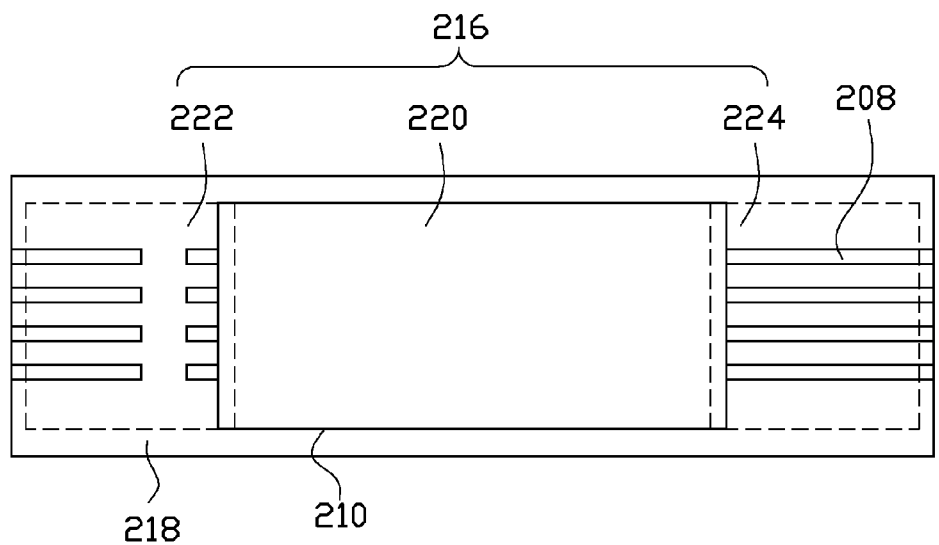
FIG. 5 is a bottom view of the second flexible PCB of FIG. 4.

In step 2, referring to FIGS. 4 and 5, a second flexible PCB 20 is provided.

The second flexible PCB 20 is also a single-sided PCB, and includes a second substrate 206, a second trace layer 208 formed on a surface of the substrate 206, and a second cover film 210 covering parts of the second trace layer 208. The material of the second substrate 206 is the same as that of the first substrate 106. The method for manufacturing the second trace layer 208 is the same as that for the first trace layer 108. The second substrate 206 includes a first surface 212 and a second surface 214 opposite to the first surface 212. The second trace layer 208 is formed on the first surface 212.

The second flexible PCB 20 includes a second product portion 216 and a third unwanted portion 218 connected to the second product portion 216. The second product portion 216 includes a second exposed portion 220, a fourth depressing portion 222, and a fifth depressing portion 224. The fourth depressing portion 222 and the fifth depressing portion 224 are respectively adjacent to opposite sides of the second exposed portion 220. The third unwanted portion 218 is adjacent to the peripheries of the second exposed portion 220, the fourth depressing portion 222, and the fifth depressing portion 224. The third unwanted portion 218 corresponds to the second unwanted portion 118 of the first flexible PCB 10. An inner border of the third unwanted portion 218 is identical to that of the second unwanted portion 118. The third unwanted portion 218 protects the second exposed portion 220, the fourth depressing portion 222, and the fifth depressing portion 224 during the processes of manufacturing the rigid-flexible PCB, and is removed after the process is finished. The second exposed portion 220 forms a bend portion of the rigid-flexible PCB. The size of the second exposed portion 220 is equal to the single respective size of the first exposed portion 120, the third depressing portion 126, and the first unwanted portion 128. The fourth depressing portion 222 and the fifth depressing portion 224 are fixedly connected to the rigid PCB. The size of the fourth depressing portion 222 is equal to that of the first depressing portion 122. The size of the fifth depressing portion 124 is equal to that of the second depressing portion 124. Each of the second exposed portion 220, the fourth depressing portion 222, and the fifth depressing portion 224 includes the second trace layer 208.

Figure 6:
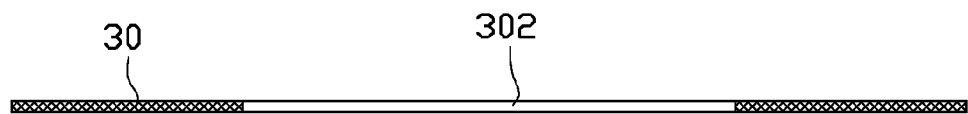
FIG. 6 is a sectional view of an adhesive film according to a first embodiment of the present disclosure.

In step 3, referring to FIG. 6, an adhesive film 30 is provided. The adhesive film 30 defines an opening 302 corresponding to the second exposed portion 220. A size of the adhesive film 30 is equal to that of the first flexible PCB 10 and the second flexible PCB 20. A size of the opening 302 is equal to a size of the second exposed portion 220.

Figure 7:
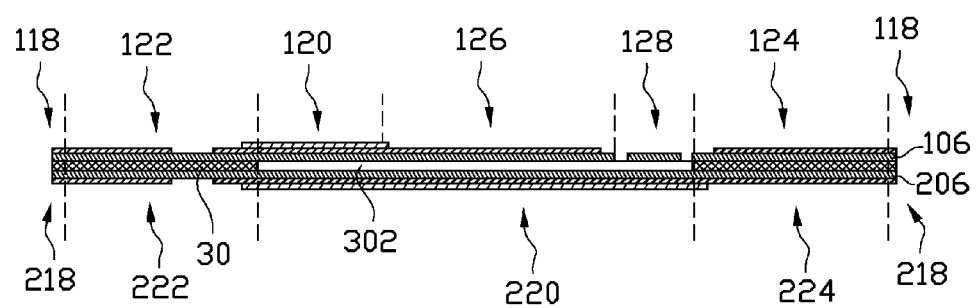
FIG. 7 is a sectional view showing the first flexible PCB of FIG. 3, the second flexible PCB of FIG. 5, and the adhesive film of FIG. 6 stacked together.

In step 4, referring to FIG. 7, the first flexible PCB 10 is adhered to the second flexible PCB 20 using the adhesive film 30. The first substrate 106 of the first flexible PCB 10 and the second substrate 206 of the second flexible PCB 20 are adhered to the adhesive film 30.

The first exposed portion 120, the third depressing portion 126, and the first unwanted portion 128 of the first flexible PCB 10 are aligned with the second exposed portion 220 of the second flexible PCB 20. The opening 302 is aligned with the second exposed portion 228 to expose the first exposed portion 120, the third depressing portion 126, the first unwanted portion 128 of the first flexible PCB 10, and the second exposed portion 228 of the second flexible PCB 20 at the opening 302. The second unwanted portion 118, the first depressing portion 122, the second depressing portion 124 of the first flexible PCB 10, and the third unwanted portion 218, the fourth depressing portion 222, and the fifth depressing portion 224 of the second flexible PCB 20 are all adhered to the adhesive film 30.

Figure 8:
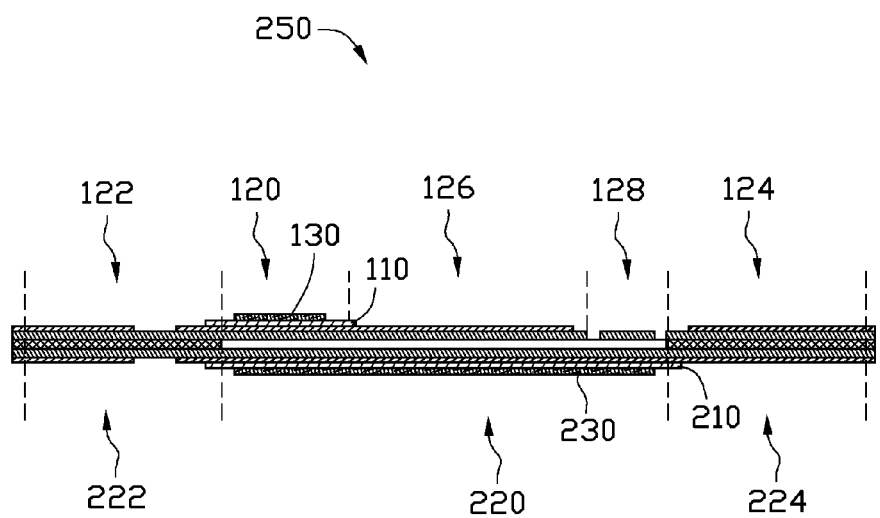
FIG. 8 is a sectional view showing a flexible multi-layer structure including release films adhered on the structure shown in FIG. 7.

In step 5, referring to FIG. 8, a first release film 130 is adhered to the first cover film 110 at the first exposed portion 120, a second release film 230 is adhered to the second cover film 210 at the second exposed portion 220, and a flexible multi-layer structure 250 is achieved.

In this embodiment, the first release film 130 covers the first exposed portion 120. The second release film 230 covers the second exposed portion 220. The first release film 130 and the second release film 230 are polyethylene terephthalate (PET) films coated with a layer of silicone oil.

Figure 9:
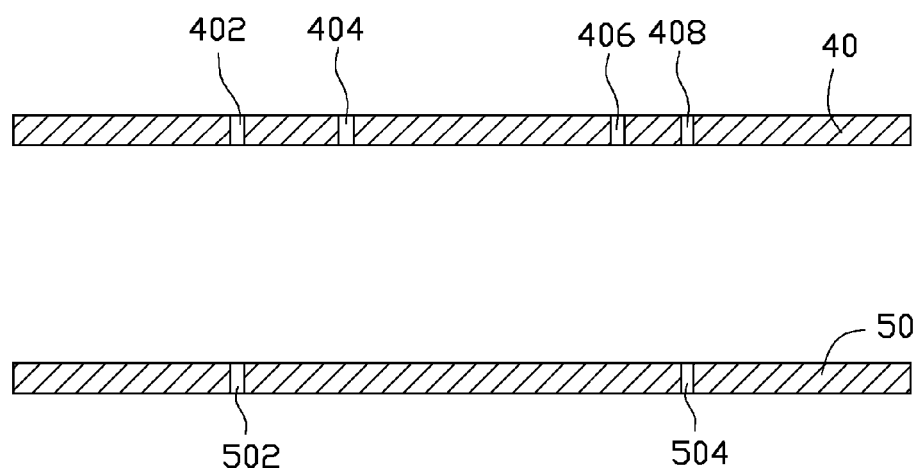
FIG. 9 is a sectional view of two semi-curable glue pieces according to a first embodiment of the present disclosure.
Figure 10:
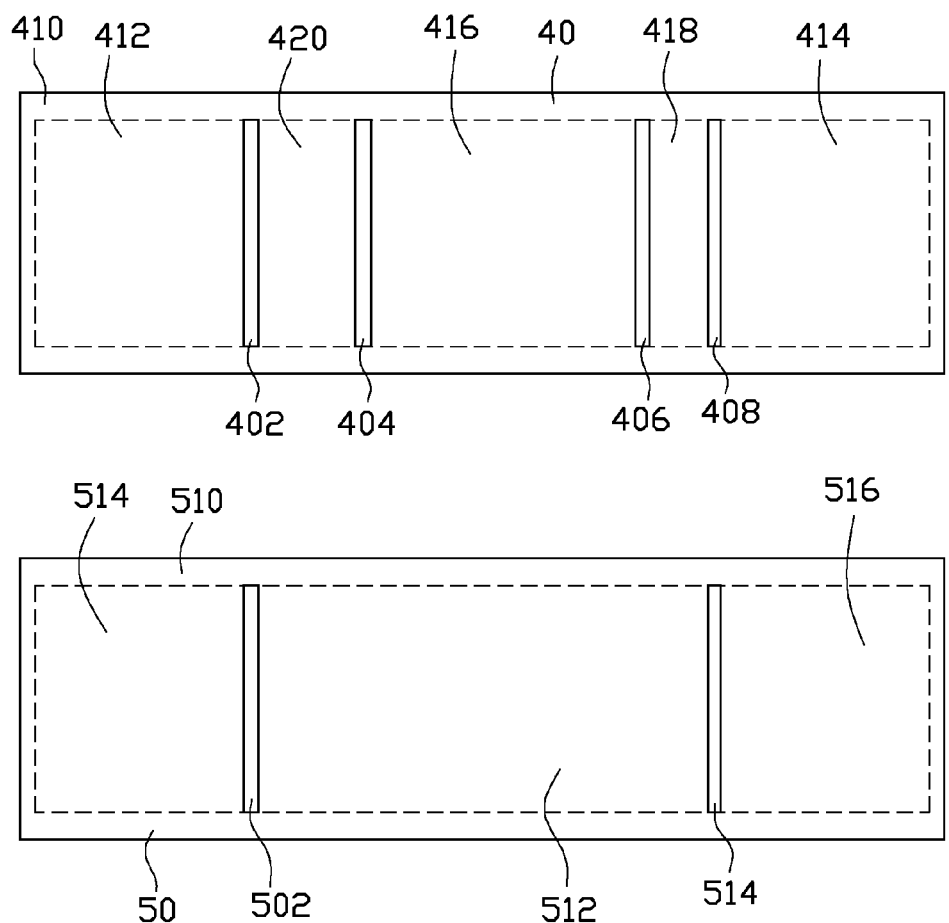
FIG. 10 is a top view of the two semi-curable glue pieces of FIG. 9.

In step 6, referring to FIGS. 9 and 10, a first semi-curable glue piece 40 and a second semi-curable glue piece 50 are provided. The first semi-curable glue piece 40 defines a third pre-cut hole 402, a fourth pre-cut hole 404, a fifth pre-cut hole 406, and a sixth pre-cut hole 408. The second semi-curable glue piece 50 defines a seventh pre-cut hole 502 and a eighth pre-cut hole 504.

A size of the first semi-curable glue piece 40 is equal to that of the first flexible PCB 10 and that of the second flexible PCB 20. The first semi-curable glue piece 40 includes a fourth unwanted portion 410, a sixth depressing portion 412, a seventh depressing portion 414, a eighth depressing portion 416, a fifth unwanted portion 418, and a sixth unwanted portion 420. The fourth unwanted portion 410, the sixth depressing portion 412, the seventh depressing portion 414, the eighth depressing portion 416, the fifth unwanted portion 418, and the sixth unwanted portion 420 are aligned with the second unwanted portion 118, the first depressing portion 122, the second depressing portion 124, the third depressing portion 126, the first unwanted portion 128, and the first exposed portion 120 respectively, and sizes of the fourth unwanted portion 410, the sixth depressing portion 412, the seventh depressing portion 414, the eighth depressing portion 416, the fifth unwanted portion 418, and the sixth unwanted portion 420 are respectively equal to that of the second unwanted portion 118, that of the first depressing portion 122, that of the second depressing portion 124, that of the third depressing portion 126, that of the first unwanted portion 128, and that of the first exposed portion 120. The sixth unwanted portion 420 defines the third pre-cut hole 402 and the fourth pre-cut hole 404. The third pre-cut hole 402 extends along the boundary between the sixth unwanted portion 420, and the sixth depressing portion 412. The fourth pre-cut hole 404 extends along the boundary between the sixth unwanted portion 420 and the eighth depressing portion 416. Two ends of both the third pre-cut hole 402 and the fourth pre-cut hole 404 are adjacent to the fourth unwanted portion 410. The fifth unwanted portion 418 defines the fifth pre-cut hole 406 and the sixth pre-cut hole 408. The fifth pre-cut hole 406 extends along the boundary between the fifth unwanted portion 418 and the eighth depressing portion 416. The sixth pre-cut hole 408 extends along the boundary between the fifth unwanted portion 418 and the seventh depressing portion 414. Two ends of both the fifth pre-cut hole 406 and the sixth pre-cut hole 408 are adjacent to the fourth unwanted portion 410.

A size of the second semi-curable glue piece 50 is equal to that of the first flexible PCB 10 and that of the second flexible PCB 20. The second semi-curable glue piece 50 includes a seventh unwanted portion 510, a eighth unwanted portion 512, a ninth depressing portion 514, and a tenth depressing portion 516. The seventh unwanted portion 510, the eighth unwanted portion 512, the ninth depressing portion 514, and the tenth depressing portion 516 are respectively aligned with the third unwanted portion 218, the second exposed portion 22, the fourth depressing portion 222, and the fifth depressing portion 224, and sizes of the seventh unwanted portion 510, the eighth unwanted portion 512, the ninth depressing portion 514, and the tenth depressing portion 516 are respectively equal to that of the third unwanted portion 218, the second exposed portion 22, the fourth depressing portion 222, and the fifth depressing portion 224. The eighth unwanted portion 512 defines the seventh pre-cut hole 502 and the eighth pre-cut hole 504. The seventh pre-cut hole 502 extends along the boundary between the eighth unwanted portion 512 and the ninth depressing portion 514. The eighth pre-cut hole 504 extends along the boundary between the eighth unwanted portion 512 and the tenth depressing portion 516. Two ends of both the seventh pre-cut hole 502 and the tenth pre-cut hole 504 are adjacent to the seventh unwanted portion 510.

In this embodiment, the first semi-curable glue piece 40 and the second semi-curable glue piece 50 are made of FR-4 Epoxy Glass Cloth.

Figure 11:
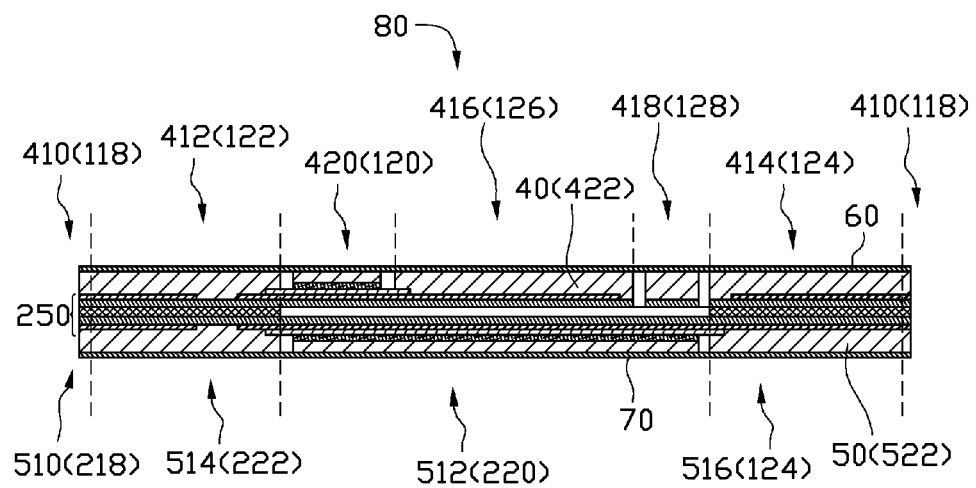
FIG. 11 is a sectional view showing a multi-layer substrate including the laminated flexible multi-layer structure of FIG. 8, the two semi-curable glue pieces of FIG. 9, and two copper foil layers.

In step 7, referring to FIG. 11, a first copper foil layer 60 and a second copper foil layer 70 are provided. The first copper foil layer 60, the first semi-curable glue piece 40, the flexible multi-layer structure 250, the second semi-curable glue piece 50, and the second copper foil layer 70 are stacked in sequence and are pressed together to obtain a multi-layer substrate 80.

The individual sizes of the first copper foil layer 60 and the second copper foil layer 70 are respectively equal to the size of the first semi-curable glue piece 40 and the size of the second semi-curable glue piece 50. During the process of pressing together, the first flexible PCB 10 of the flexible multi-layer structure 250 is adjacent to the first semi-curable glue piece 40, and the second flexible PCB 20 is adjacent to the second semi-curable glue piece 50. The first copper foil layer 60 covers the first semi-curable glue piece 40. The second copper foil layer 70 covers the second semi-curable glue piece 50. The fourth unwanted portion 410, the sixth depressing portion 412, the seventh depressing portion 414, the eighth depressing portion 416, the fifth unwanted portion 418, and the sixth unwanted portion 420 of the first semi-curable glue piece 40 are respectively aligned with the second unwanted portion 118, the first depressing portion 122, the second depressing portion 124, the third depressing portion 126, the first unwanted portion 128, and the first exposed portion 120 of the first flexible PCB 10. The seventh unwanted portion 510, the eighth unwanted portion 512, the ninth depressing portion 514, and the tenth depressing portion 516 of the second semi-curable glue piece 50 are respectively aligned with the third unwanted portion 218, the second exposed portion 220, the fourth depressing portion 222, and the fifth depressing portion 224 of the second flexible PCB 20. When pressing together, the multi-layer substrate 80 is heated to harden the first and second semi-curable glue pieces 40, 50 to form first and second rigid substrates 422, 522. The first rigid substrate 422 is firmly adhered to the first copper foil layer 60 and the first flexible PCB 10. The second rigid substrate 522 is firmly adhered to the second copper foil layer 70 and the second flexible PCB 20.

Figure 12:
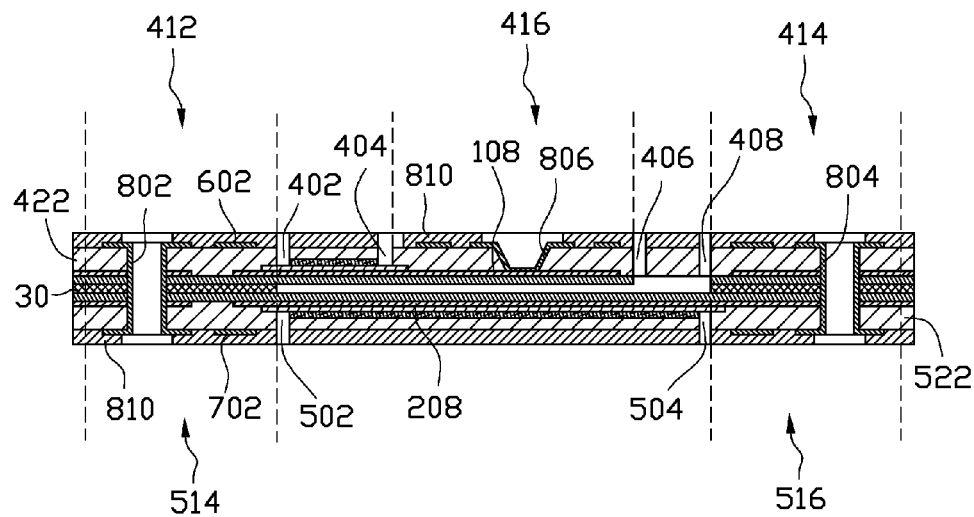
FIG. 12 is similar to FIG. 11, except that trace layers are formed on the copper foil layers.

In step 8, refer to FIG. 12. The first and second copper foil layers 60, 70 are selectively etched to form third and fourth trace layers 602, 702, and to form a first through via 802, a second through via 804, and a first blind via 806. Solder masks 810 are formed on be third trace layer 602 and the fourth trace layer 702.

Each of the sixth depressing portion 412, the seventh depressing portion 414, and the eighth depressing portion 416 of the first rigid substrate 422 includes the third trace layer 602. The ninth depressing portion 514, and the tenth depressing portion 516 of the second rigid substrate 522 both include the fourth trace layer 702. In this embodiment, the parts of the first copper foil layer 60 which face the third pre-cut hole 402, the fourth pre-cut hole 404, the fifth pre-cut hole 406, and the sixth pre-cut hole 408 of the first rigid substrate 422 are removed by etching to expose the third pre-cut hole 402, the fourth pre-cut hole 404, the fifth pre-cut hole 406, and the sixth pre-cut hole 408. The parts of the second copper foil layer 70 which face the seventh pre-cut hole 502 and the eighth pre-cut hole 504 of the second rigid substrate 522 are removed by etching to expose the seventh pre-cut hole 502 and the eighth pre-cut hole 504. The sixth depressing portion 412 of the first semi-curable glue piece 40 defines the first through via 802. The seventh depressing portion 414 of the first semi-curable glue piece 40 defines the second through via 804. The first and second through vias 802, 804 each extend through the third trace layer 602, the first rigid substrate 422, the first flexible PCB 10, the adhesive film 30, the second flexible PCB 20, the second rigid substrate 522, and the fourth trace layer 702 to electrically connect the third trace layer 602, the first trace layer 108, the second trace layer 208, and the fourth trace layer 702. The eighth depressing portion 416 defines the first blind via 806. The first blind via 806 extends through the third trace layer 602 and the first rigid substrate 422 and is terminated at the first trace layer 108 to electrically connect the third trace layer 602 and the first trace layer 108.

Figure 13:
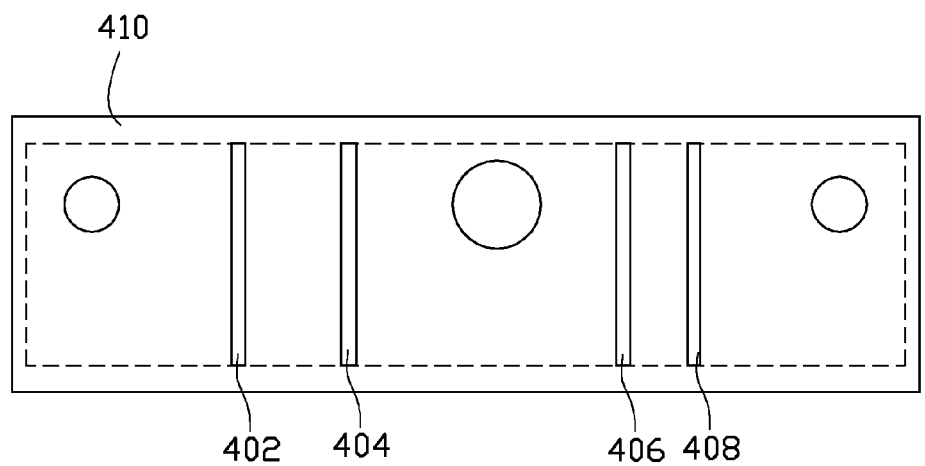
FIG. 13 is a top view of the multi-layer substrate of FIG. 12 showing a cutting line.
Figure 14:
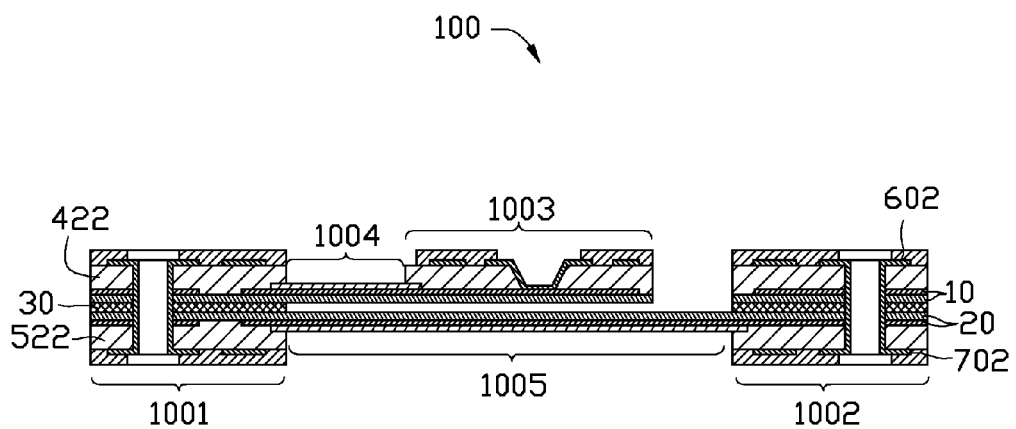
FIG. 14 is a sectional view of a rigid-flexible PCB obtained by cutting the multi-layer substrate of FIG. 13 along the cutting line.

In step 9, referring to FIGS. 13 and 14, the multi-layer substrate 80 is cut along the boundary of the fourth unwanted portion 410 to remove parts of the multi-layer substrate 80 which correspond to the fourth unwanted portion 410. The fifth unwanted portion 418, the sixth unwanted portion 420 of the first rigid substrate 422, the first copper foil layer 60 on the fifth unwanted portion 418, and the sixth unwanted portion 420, the first unwanted portion 128 of the first flexible PCB 10, the eighth unwanted portion 512 of the second rigid substrate 522, and the second copper foil layer 70 on the eighth unwanted portion 512 are peeled off. In this way, a rigid-flexible PCB 100 is achieved.

In this embodiment, the second unwanted portion 118, the third unwanted portion 218, the fourth unwanted portion 410, the seventh unwanted portion 510, and parts of the first copper foil layer 60, the second copper foil layer 70, and the adhesive film 30 which correspond to the fourth unwanted portion 410 are removed when cutting the multi-layer substrate 80. As two ends of the first pre-cut hole 102 and the second pre-cut hole 104 are adjacent to the second unwanted portion 118, and the fifth and sixth unwanted portion 420 are adjacent to the fourth unwanted portion 410, after the second unwanted portion 118 is removed, the first unwanted portion 128 and the sixth unwanted portion 420 naturally separate from other parts of the multi-layer substrate 80 and are easily removed. As there are the third pre-cut hole 402, the fourth pre-cut hole 404, the fifth pre-cut hole 406, the sixth pre-cut hole 408, the seventh pre-cut hole 502, and the eighth pre-cut hole 504, after the second unwanted portion 118 is removed, the fifth unwanted portion 418 and the sixth unwanted portion 420 naturally separate from other parts of the first rigid substrate 422, and the eighth unwanted portion naturally separates from other parts of the second rigid substrate 522. In addition, the existence of the first release film 130 and the second release film 230 make it easy to peel off the fifth unwanted portion 418 and the sixth unwanted portion 420 of the first rigid substrate 422, the first copper foil layer 60 on the fifth unwanted portion 418 and on the sixth unwanted portion 420, the first unwanted portion 128 of the first flexible PCB 10, the eighth unwanted portion 512 of the second rigid substrate 522, and the second copper foil layer 70 on the eighth unwanted portion 512.

The sixth depressing portion 412 of the first rigid substrate 422, the first depressing portion 122 of the first flexible PCB 10, the fourth depressing portion 222 of the second flexible PCB 20, the ninth depressing portion 514 of the second rigid substrate 522, and parts of the third trace layer 602 and of the fourth trace layer 702 corresponding to the sixth depressing portion 412 form a first rigid portion 1001 of the rigid-flexible PCB 100. The seventh depressing portion 414 of the first rigid substrate 422, the second depressing portion 124 of the first flexible PCB 10, the fifth depressing portion 224 of the second flexible PCB 20, the tenth depressing portion 516 of the second rigid substrate 522, and parts of the third trace layer 602 and of the fourth trace layer 702 corresponding to the seventh depressing portion 414 form a second rigid portion 1002 of the rigid-flexible PCB 100. The eighth depressing portion 416 of the first rigid substrate 422, the third depressing portion 126 of the first flexible PCB 10, and parts of the third trace layer 602 corresponding to the eighth depressing portion 416 form a third rigid portion 1003 of the rigid-flexible PCB 100. The first exposed portion 120 of the first flexible PCB 10 forms the first flexible portion 1004 of the rigid-flexible PCB 100. The second exposed portion 220 forms the second flexible portion 1005 of the rigid-flexible PCB 100. The second flexible portion 1005 connects the first rigid portion 1001 to the second rigid portion 1002. The first flexible portion 1004 connects the first rigid portion 1001 to the third rigid portion 1003. The third rigid portion 1003 is spaced from the second rigid portion 1002.

In this embodiment, the rigid-flexible PCB 100 includes the first flexible PCB 10, the second flexible PCB 20, the first rigid substrate 422, the second rigid substrate 522, the third trace layer 602, and the fourth trace layer 702. The first flexible PCB 10 includes the stacked first substrate 106 and the first trace layer 108. The first flexible PCB 10 includes the first depressing portion 122, the first exposed portion 120, and the third depressing portion 126 connected in series. The first flexible PCB 10 further includes the second depressing portion 124 separated from the first depressing portion 122, the first exposed portion 120 and the third depressing portion 126, these being positioned adjacent to a side of the third depressing portion 126 away from the first exposed portion 120. The second flexible PCB 20 includes the second substrate 206 and the second trace layer 208 stacked together. The second flexible PCB 20 includes the fourth depressing portion 222, the second exposed portion 220, and the fifth depressing portion 224 connected in series. A length of the second exposed portion 220 is larger than a sum of a length of the first exposed portion 120 and a length of the third depressing portion 126. The fourth depressing portion 222 is adhered to the first depressing portion 122. The fifth depressing portion 224 is adhered to the second depressing portion 124. The first exposed portion 120 and the third depressing portion 126 are opposite to the second exposed portion 220. The second substrate 206 of the second flexible PCB 20 is adjacent to the first substrate 106 of the first flexible PCB 10. The first rigid substrate 422 is formed on a side of the first flexible PCB 10 away from the second flexible PCB 20. The first rigid substrate 422 includes the sixth depressing portion 412 laminated on the first depressing portion 122, the seventh depressing portion 414 laminated on the second depressing portion 124, and the eighth depressing portion 416 laminated on the third depressing portion 126. The first exposed portion 120 is exposed to form the first flexible portion 1004. The second rigid substrate 522 is formed on a side of the second flexible PCB 20 away from the first flexible PCB 10. The second rigid substrate 522 includes the ninth depressing portion 514 laminated on the fourth depressing portion 222, and the tenth depressing portion 516 laminated on the fifth depressing portion 224. The second exposed portion 220 is exposed to form the second flexible portion 1005. The third trace layer 602 is formed on a side of the first rigid substrate 422 away from the first flexible PCB 10. Each of the sixth depressing portion 412, the seventh depressing portion 414, and the eighth depressing portion 416 includes the third trace layer 602. The fourth trace layer 702 is formed on a side of the second rigid substrate 522 away from the second flexible PCB 20. The ninth depressing portion 514 and the tenth depressing portion 516 both include the fourth trace layer 702. The rigid-flexible PCB 100 further includes the first cover film 110 covering the first trace layer 108 on the first exposed portion 120 and the second cover film 210 covering the second trace layer 208 on the second exposed portion 220.

Referring to FIGS. 1 to 5 and 15 to 25, a method for manufacturing a rigid-flexible PCB 200 according to a second embodiment is disclosed. The method includes steps as follows.

In step 1, referring to FIGS. 1 to 5, the first flexible PCB 10 and the second flexible PCB 20 are provided. The first flexible PCB 10 has the first pre-cut hole 102 and the second pre-cut hole 104.

Figure 15:
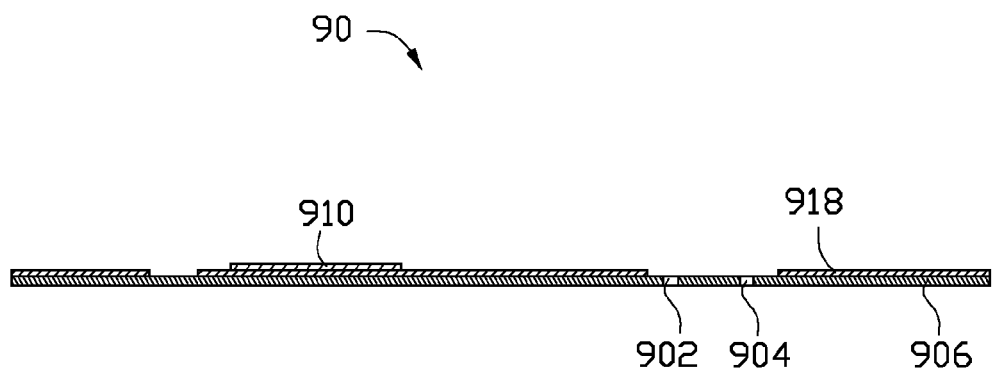
FIG. 15 is a sectional view of a third flexible PCB according to a second embodiment of the present disclosure.
Figure 16:
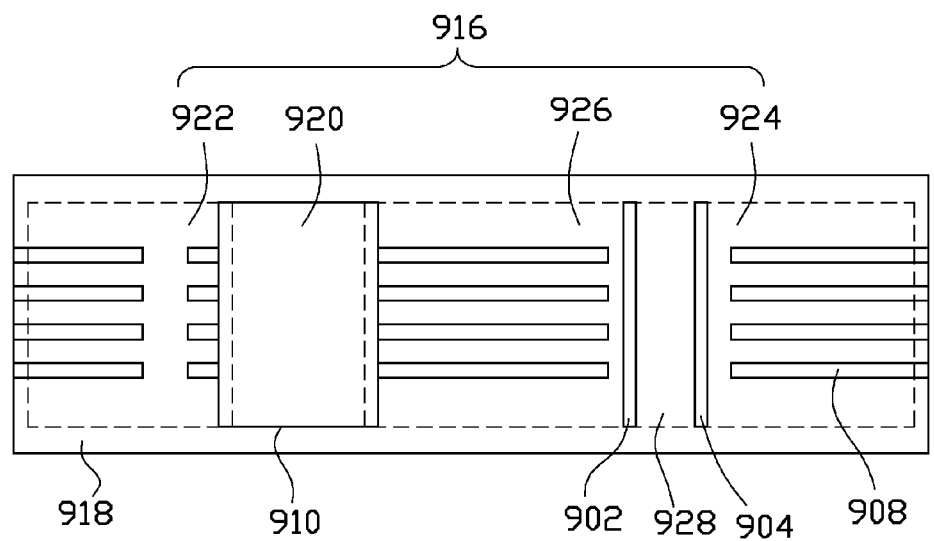
FIG. 16 is a top view of the third flexible PCB of FIG. 15.

In step 2, referring to FIGS. 15 and 16, a third flexible PCB 90 is provided. The third flexible PCB 90 defines a long strip-shaped ninth pre-cut hole 902 and a tenth pre-cut hole 904.

In this embodiment, the third flexible PCB 90 is a single-sided PCB, and includes a third substrate 906, a fifth trace layer 908 formed on the surface of the third substrate 906, and a third cover film 910 formed on parts of the fifth trace layer 908. The third substrate 906 is made of flexible resin, such as PI, PET, or PEN.

The third flexible PCB 90 includes a third product portion 916, a ninth unwanted portion 918, and a tenth unwanted portion 928. The third product portion 916 includes a third exposed portion 920, an eleventh depressing portion 922, a twelfth depressing portion 924, and a thirteenth depressing portion 926. The eleventh depressing portion 922 is adjacent to a side of the third exposed portion 920. The twelfth depressing portion 924 and the thirteenth depressing portion 926 are adjacent to an opposite side of the third exposed portion 920. The thirteenth depressing portion 926 is located between the third exposed portion 920 and the twelfth depressing portion 924 and connects to the third exposed portion 920. The tenth unwanted portion 928 is located between the twelfth depressing portion 924 and the thirteenth depressing portion 926 and connects to the twelfth depressing portion 924 and the thirteenth depressing portion 926. The ninth unwanted portion 918 is adjacent to the peripheries of the eleventh depressing portion 922, the third exposed portion 920, the thirteenth depressing portion 926, the tenth unwanted portion 928, and the twelfth depression portion 924.

The ninth unwanted portion 918 and the tenth unwanted portion 928 protect the third exposed portion 920, the eleventh depressing portion 922, the twelfth depressing portion 924, and the thirteen depressing portion 926 during the process of manufacturing the rigid-flexible PCB, and are removed after the process is finished.

The third exposed portion 920 forms a bend portion of the rigid-flexible PCB, and the eleventh depressing portion 922, the twelfth depressing portion 924, and the thirteenth depressing portion 926 are fixedly connected to a rigid PCB. Each of the third exposed portion 920, the eleventh depressing portion 922, the twelfth depressing portion 924, and the thirteenth depressing portion 926 includes the fifth trace layer 908. The third cover film 910 covers the whole third exposed portion 920 and the parts of the eleventh depressing portion 922 and the thirteen depressing portion 926 which are adjacent to the third exposed portion 920. The third cover film 910 is a solder mask.

The tenth unwanted portion 928 includes the ninth pre-cut hole 902 and the tenth pre-cut hole 904. The ninth pre-cut hole 902 extends along the boundary between the thirteen depressing portion 926 and the tenth unwanted portion 928. The tenth pre-cut hole 904 extends along the boundary between the tenth unwanted portion 928 and the twelfth depressing portion 924. Two ends of both the ninth pre-cut hole 902 and the tenth pre-cut hole 904 are adjacent to the ninth unwanted portion 918.

In other embodiments, the third cover film 910 covers the whole of the third exposed portion 920.

Figure 17:
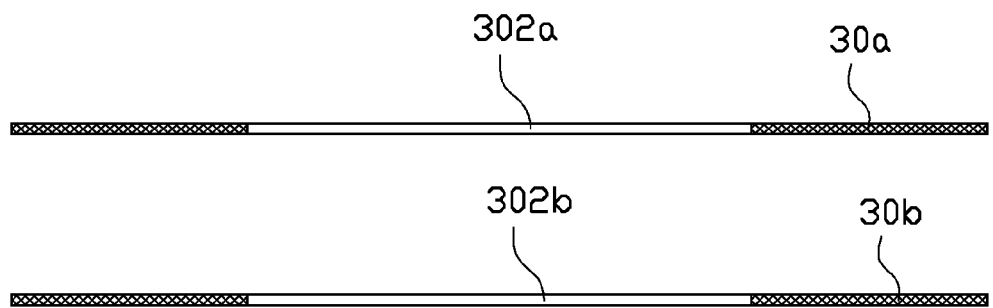
FIG. 17 is a sectional view of two adhesive films according to a second embodiment of the present disclosure.

In step 3, referring to FIG. 17, a first adhesive film 30a and a second adhesive film 30b are provided. The first adhesive films 30a defines a first opening 302a corresponding to the second exposed portion 220. The second adhesive film 30b defines a second opening 302b corresponding to the second exposed portion 220. A size of the first and second adhesive film 30a, 30b is equal to a size of the second flexible PCB 20. A size of the first and second opening 302a, 302b is equal to a size of the second exposed portion 220.

Figure 18:
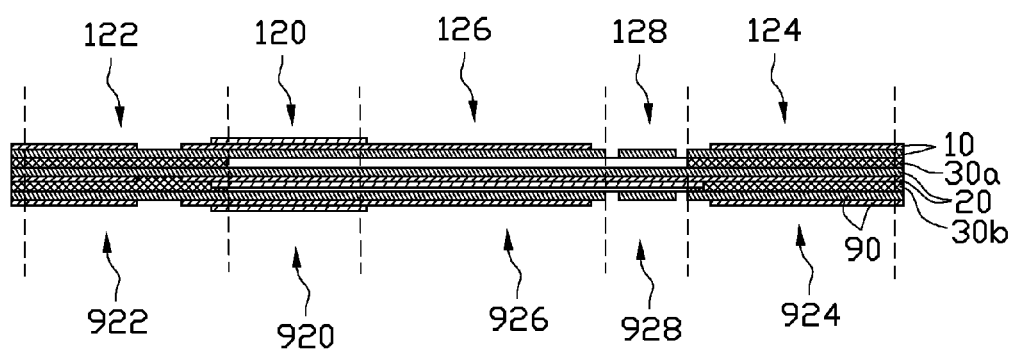
FIG. 18 is a sectional view showing the first flexible PCB of FIG. 3, the second flexible PCB of FIG. 5, the third flexible PCB of FIG. 16, and the adhesive films of FIG. 17 stacked together.

In step 4, referring to FIG. 18, the first flexible PCB 10 and the third flexible PCB 90 are arranged on opposite sides of the second flexible PCB 20, the first adhesive film 30a is arranged between the first and second flexible PCBs 10, 20, and the second adhesive film 30b is arranged between the second and third flexible PCBs 20, 90. The first, second, and third flexible PCBs 10, 20, 90 and the first and second adhesive films 30a, 30b are pressed together. In this way, the first, second, and third flexible PCBs 10, 20, 90 are connected together by the first and second adhesive films 30a, 30b. The first substrate 106 of the first flexible PCB 10 and the second substrate 206 of the second flexible PCB 20 are adhered to the first adhesive film 30a. The fifth trace layer 908 of the third flexible PCB 90 and the second trace layer 208 of the second flexible PCB 20 are adhered to the second adhesive film 30b.

The first exposed portion 120, the third depressing portion 126, and the first unwanted portion 128 of the first flexible PCB 10 are aligned with the second exposed portion 220 of the second flexible PCB 20. The third exposed portion 920, the thirteenth depressing portion 926, and the tenth unwanted portion 928 of the third flexible PCB 90 are aligned with the second exposed portion 220 of the second flexible PCB 20. The first opening 302 and the second opening 302b are adjacent to the third unwanted portion 218. The first exposed portion 120, the third depressing portion 126, and the first unwanted portion 128 of the first flexible PCB 10 are exposed at the first opening 302a. The third exposed portion 920, the thirteen depressing portion 926, and the tenth unwanted portion 928 of the third flexible PCB 90 are exposed at the second opening 302b. Opposite sides of the second exposed portion 220 of the second flexible PCB 20 are respectively exposed at the first opening 302a and at the second opening 302b.

Figure 19:
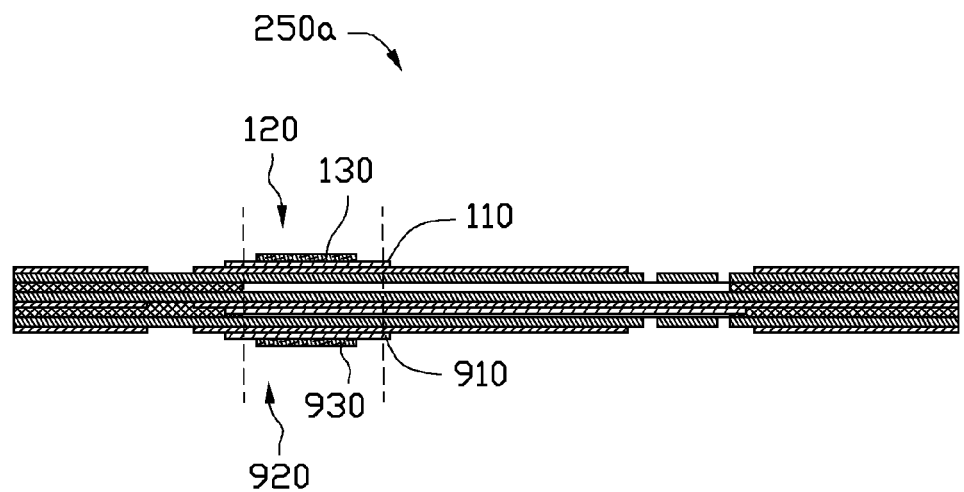
FIG. 19 is a sectional view showing a flexible multi-layer structure including release films adhered on the structure shown in FIG. 18.

In step 5, referring to FIG. 19, the first release film 130 is adhered to the first cover film 110 at the first exposed portion 120, a third release film 930 is adhered to the third cover film 910 at the third exposed portion 920, and a flexible multi-layer structure 250a is achieved.

In this embodiment, the first release film 130 covers the first exposed portion 120. The third release film 930 covers the third exposed portion 920. The first release film 130 and the third release film 930 are polyethylene PET films coated with a layer of silicone oil.

Figure 20:
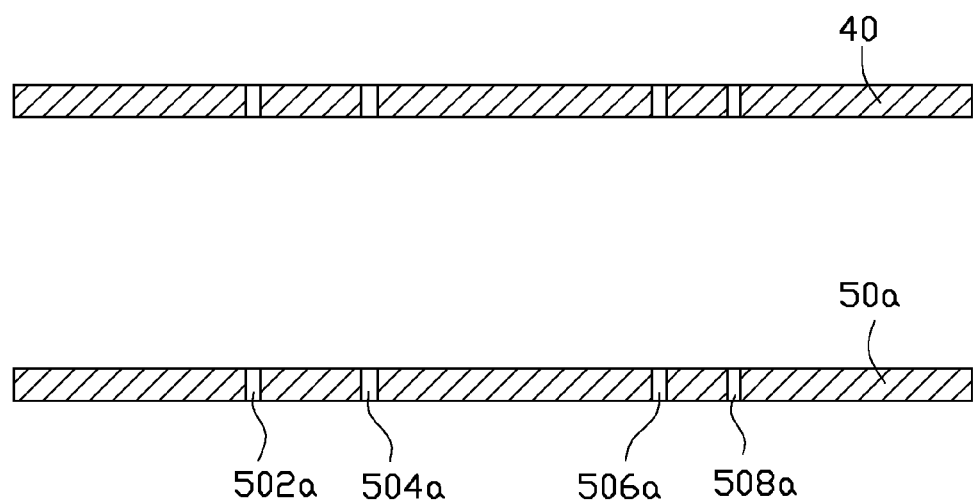
FIG. 20 is a sectional view of two semi-curable glue pieces according to the second embodiment of the present disclosure.
Figure 21:
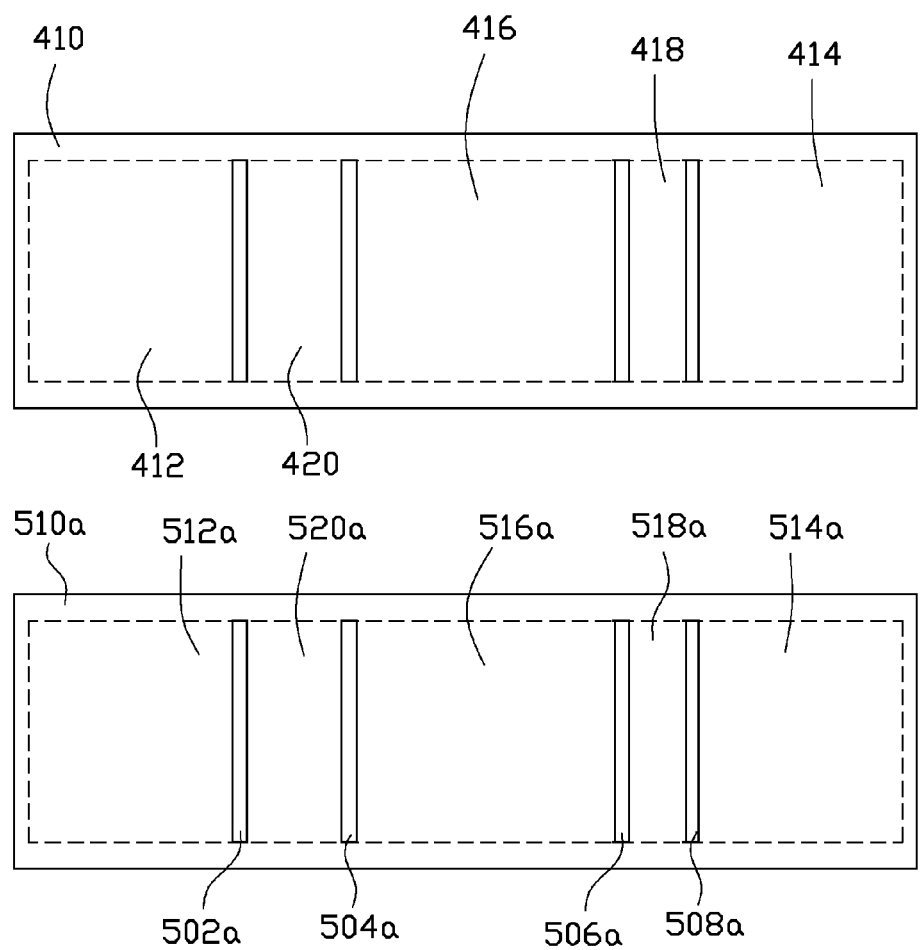
FIG. 21 is a top view of the two semi-curable glue pieces of FIG. 20.

In step 6, referring to FIGS. 20 and 21, a first semi-curable glue piece 40 and a second semi-curable glue piece 50a are provided. The first semi-curable glue piece 40 defines the third pre-cut hole 402, the fourth pre-cut hole 404, the fifth pre-cut hole 406, and the sixth pre-cut hole 408. The second semi-curable glue piece 50a defines an eleventh pre-cut hole 502a, a twelfth pre-cut hole 504a, a thirteenth pre-cut hole 506a, and a fourteenth pre-cut hole 508a.

A size of the second semi-curable glue piece 50a is equal to that of the third flexible PCB 90. The second semi-curable glue piece 50a includes an eleventh unwanted portion 510a, a fourteenth depressing portion 512a, a fifteenth depressing portion 514a, a sixteenth depressing portion 516a, a twelfth unwanted portion 518a, and a thirteenth unwanted portion 520a. The eleventh unwanted portion 510a, the fourteenth depressing portion 512a, the fifteenth depressing portion 514a, the sixteenth depressing portion 516a, the twelfth unwanted portion 518a, and the thirteenth unwanted portion 520a are respectively aligned with the ninth unwanted portion 918, the eleventh depressing portion 922, the twelfth depressing portion 924, the thirteenth depressing portion 926, the tenth unwanted portion 928, and the third exposed portion 920 of the third flexible PCB 90, and sizes of the eleventh unwanted portion 510a, the fourteenth depressing portion 512a, the fifteenth depressing portion 514a, the sixteenth depressing portion 516a, the twelfth unwanted portion 518a, and the thirteenth unwanted portion 520a are respectively equal to those of the ninth unwanted portion 918, the eleventh depressing portion 922, the twelfth depressing portion 924, the thirteenth depressing portion 926, the tenth unwanted portion 928, and the third exposed portion 920. The thirteenth unwanted portion 520a defines the eleventh pre-cut hole 502a and the twelfth pre-cut hole 504a. The eleventh pre-cut hole 502a extends along the boundary between the thirteenth unwanted portion 520a and the fourteenth depressing portion 512a. The twelfth pre-cut hole 504a extends along the boundary between the thirteenth unwanted portion 520a and the sixteenth depressing portion 516a. Two ends of both the eleventh pre-cut hole 502a and the twelfth pre-cut hole 504a are adjacent to the eleventh unwanted portion 510a. The twelfth unwanted portion 518a defines the thirteenth pre-cut hole 506a and the fourteenth pre-cut hole 508a. The thirteenth pre-cut hole 506a extends along the boundary between the twelfth unwanted portion 518a and the sixteenth depressing portion 516a. The fourteenth pre-cut hole 508a extends along the boundary between the twelfth unwanted portion 518a and the fifteenth depressing portion 514a. Two ends of both the thirteenth pre-cut hole 506a and the fourteenth pre-cut hole 508a are adjacent to the eleventh unwanted portion 510a.

In this embodiment, the first semi-curable glue piece 40 and the second semi-curable glue piece 50a are made of FR-4 Epoxy Glass Cloth.

Figure 22:
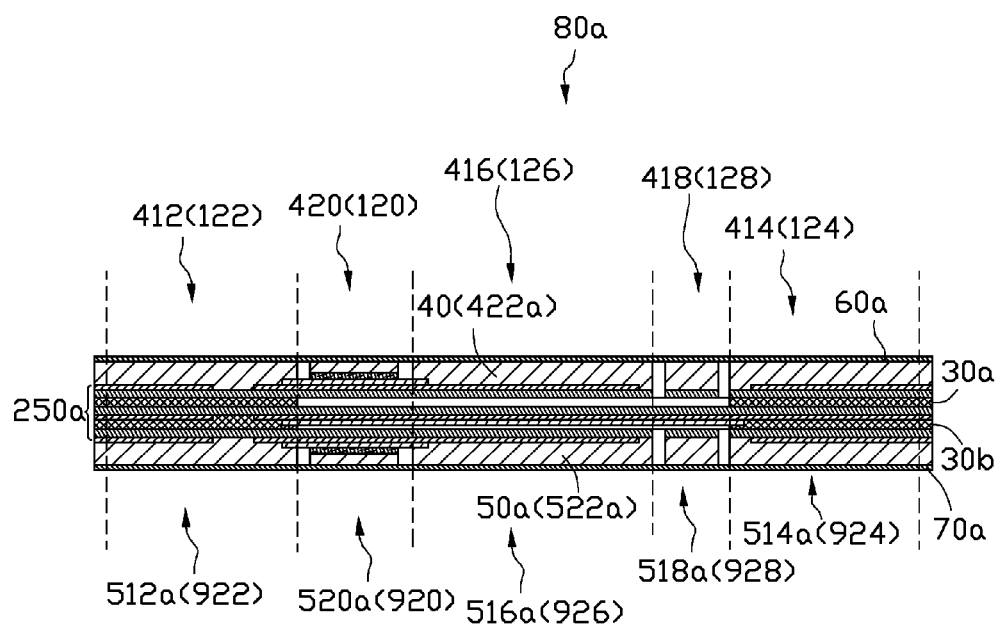
FIG. 22 is a sectional view showing a multi-layer substrate including the laminated flexible multi-layer structure of FIG. 19, the two semi-curable glue pieces of FIG. 20, and two copper foil layers.

In step 7, referring to FIG. 22, a first copper foil layer 60a and a second copper foil layer 70a are provided. The first copper foil layer 60a, the first semi-curable glue piece 40, the flexible multi-layer structure 250a, the second semi-curable glue piece 50a, and the second copper foil layer 70a are stacked in sequence and are pressed together to obtain a multi-layer substrate 80a.

The single size of the first copper foil layer 60a and the second copper foil layer 70a is equal to the single size of the first semi-curable glue piece 40 and the second semi-curable glue piece 50a. During the process of pressing, the first flexible PCB 10 of the flexible multi-layer structure 250a is adjacent to the first semi-curable glue piece 40, and the third flexible PCB 90 is adjacent to the second semi-curable glue piece 50a. The first copper foil layer 60a covers the first semi-curable glue piece 40. The second copper foil layer 70a covers the second semi-curable glue piece 50a. The fourth unwanted portion 410, the sixth depressing portion 412, the seventh depressing portion 414, the eighth depressing portion 416, the fifth unwanted portion 418, and the sixth unwanted portion 420 of the first semi-curable glue piece 40 are respectively aligned with the second unwanted portion 118, the first depressing portion 122, the second depressing portion 124, the third depressing portion 126, the first unwanted portion 128, and the first exposed portion 120 of the first flexible PCB 10. The eleventh unwanted portion 510a, the fourteen depressing portion 512a, the fifteenth depressing portion 514a, the sixteenth depressing portion 516a, the twelfth unwanted portion 518a, and the thirteenth unwanted portion 520a of the second semi-curable glue piece 50a are respectively aligned with the ninth unwanted portion 918, the eleventh depressing portion 922, the twelfth depressing portion 924, the thirteenth depressing portion 926, the tenth unwanted portion 928, and the third exposed portion 920 of the third flexible PCB 90. When pressing together, the multi-layer substrate 80a is heated to harden the first and second semi-curable glue pieces 40, 50a to form first and second rigid substrates 422a, 522a. The first rigid substrate 422a is firmly adhered to the first copper foil layer 60a and the first flexible PCB 10. The second rigid substrate 522a is firmly adhered to the second copper foil layer 70a and the third flexible PCB 90.

Figure 23:
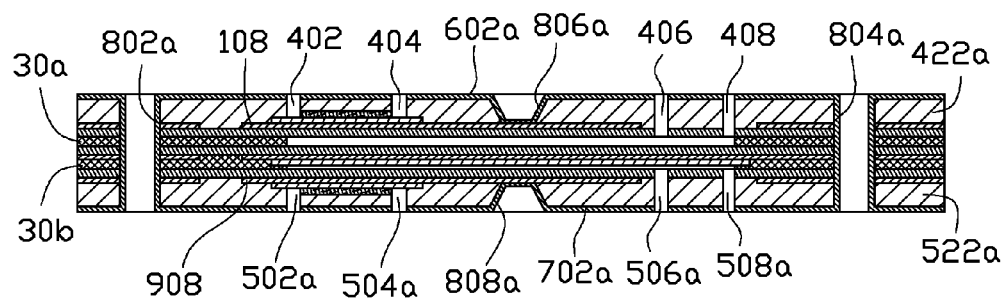
FIG. 23 is similar to FIG. 22, except that trace layers are formed on the copper foil layers.

In step 8, refer to FIG. 23. The first and second copper foil layers 60a, 70a are selectively etched to form third and fourth trace layers 602a, 702a, and to form a first through via 802a, a second through via 804a, a first blind via 806a and a second blind via 808a.

The sixth depressing portion 412, the seventh depressing portion 414, and the eighth depressing portion 416 of the first rigid substrate 422a all include the third trace layer 602a. The eleventh depressing portion 922, the twelfth depressing portion 924, and the thirteenth depressing portion 926 of the second rigid substrate 522a all include the fourth trace layer 702a. In this embodiment, the parts of the first copper foil layer 60a which face the third pre-cut hole 402, the fourth pre-cut hole 404, the fifth pre-cut hole 406, and the sixth pre-cut hole 408 of the first rigid substrate 422a are removed by etching to expose the third pre-cut hole 402, the fourth pre-cut hole 404, the fifth pre-cut hole 406, and the sixth pre-cut hole 408. The parts of the second copper foil layer 70a which face the eleventh pre-cut hole 502a, the twelfth pre-cut hole 504a, the thirteenth pre-cut hole 506a, and the fourteenth pre-cut hole 508a of the second rigid substrate 522a are removed by etching to expose the eleventh pre-cut hole 502a, the twelfth pre-cut hole 504a, the thirteenth pre-cut hole 506a, and the fourteenth pre-cut hole 508a. The sixth depressing portion 412 of the first semi-curable glue piece 40 defines the first through via 802a. The seventh depressing portion 414 of the first semi-curable glue piece 40 defines the second through via 804a. The first and second through vias 802a, 804a each extend through the third trace layer 602a, the first rigid substrate 422a, the first flexible PCB 10, the first adhesive film 30a, the second flexible PCB 20, the second adhesive film 30b, the third flexible PCB 90, the second rigid substrate 522a, and the fourth trace layer 702a to electrically connect the third trace layer 602a, the first trace layer 108, the second trace layer 208, the fifth trace layer 908, and the fourth trace layer 702a. The eighth depressing portion 416 defines the first blind via 806a. The first blind via 806a extends through the third trace layer 602a and the first rigid substrate 422a, and is terminated at the first trace layer 108 to electrically connect the third trace layer 602a and the first trace layer 108. The twelfth depressing portion 924 of the second semi-curable piece 50a defines the second blind via 808a. The second blind via 808a extends through the fourth trace layer 702a and the second rigid substrate 522a, and is terminated at the fifth trace layer 908 to electrically connect the fourth trace layer 702a and the fifth trace layer 908.

Figure 24:
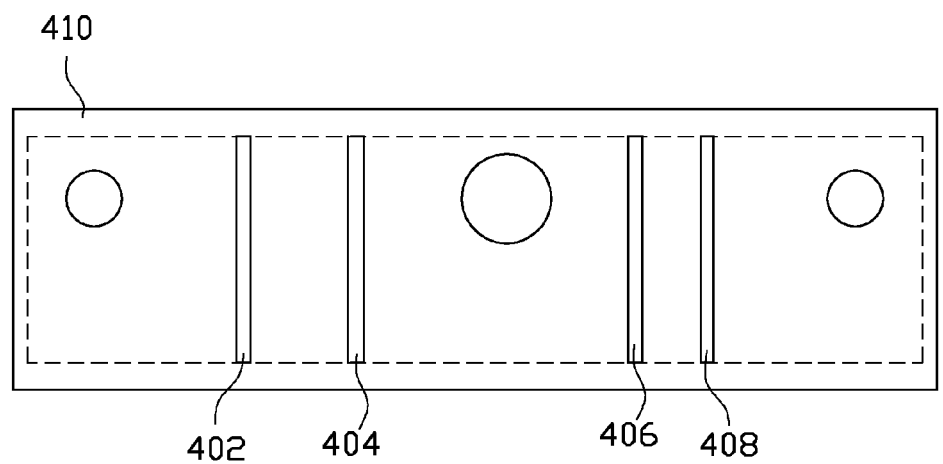
FIG. 24 is a top view of the multi-layer substrate of FIG. 23 showing a cutting line.
Figure 25:
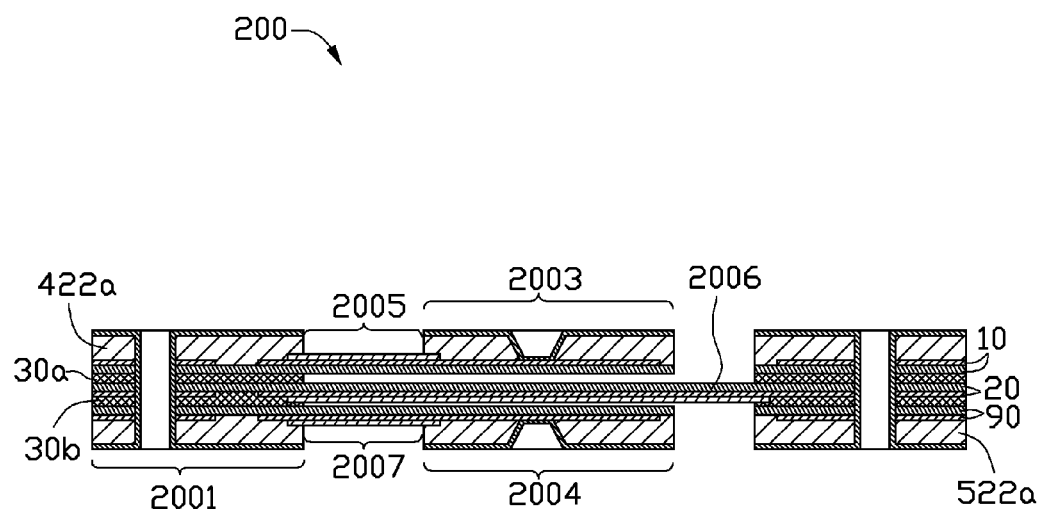
FIG. 25 is a sectional view of a rigid-flexible PCB obtained by cutting the multi-layer substrate of FIG. 24 along the cutting line.

In step 9, referring to FIGS. 24 and 25, the multi-layer substrate 80a is cut along the boundary of the fourth unwanted portion 410 to remove parts of the multi-layer substrate 80a corresponding to the fourth unwanted portion 410. The fifth unwanted portion 418, the sixth unwanted portion 420 of the first rigid substrate 422a, the first copper foil layer 60a on the fifth unwanted portion 418 and on the sixth unwanted portion 420, the first unwanted portion 128 of the first flexible PCB 10, the twelfth unwanted portion 518a, and the thirteenth unwanted portion 520a of the second semi-curable glue piece 50a, the second copper foil layer 70a on the twelfth unwanted portion 518a and on the thirteenth unwanted portion 520a, and the tenth unwanted portion 928 of the third flexible PCB 90 are peeled off. In this way, a rigid-flexible PCB 200 is achieved.

In this embodiment, the second unwanted portion 118, the third unwanted portion 218, the fourth unwanted portion 410, the seventh unwanted portion 510, and parts of the first copper foil layer 60, the second copper foil layer 70, the first adhesive film 30a and the second adhesive film 30b corresponding to the fourth unwanted portion 410 are removed when cutting the multi-layer substrate 80a. As there is pre-existence of the first pre-cut hole 102, the second pre-cut hole 104, the third pre-cut hole 402, the fourth pre-cut hole 404, the fifth pre-cut hole 406, the sixth pre-cut hole 408, the ninth pre-cut hole 902, the tenth pre-cut hole 904, the eleventh pre-cut hole 502a, the twelfth pre-cut hole 504a, the thirteenth pre-cut hole 506a, the fourteenth pre-cut hole 508a, and the first release film 130 and the second release film 230, it is easy to peel off the second unwanted portion 118, the third unwanted portion 218, the fourth unwanted portion 410, the seventh unwanted portion 510, the ninth unwanted portion 918, the first copper foil layer 60 on the fourth unwanted portion 410, the second copper foil layer 70 on the fourth unwanted portion 410, and the first and second adhesive films 30a, 30b on the fourth unwanted portion 410.

The sixth depressing portion 412 of the first rigid substrate 422a, the first depressing portion 122 of the first flexible PCB 10, the fourth depressing portion 222 of the second flexible PCB 20, the fourth depressing portion 222 of the second flexible PCB 20, the eleventh depressing portion 922 of the third flexible PCB 90, the fourteenth depressing portion 512a of the second rigid substrate 522a, and parts of the third trace layer 602a and of the fourth trace layer 702a corresponding to the sixth depressing portion 412 together form a first rigid portion 2001 of the rigid-flexible PCB 200. The seventh depressing portion 414 of the first rigid substrate 422a, the second depressing portion 124 of the first flexible PCB 10, the fifth depressing portion 224 of the second flexible PCB 20, the twelfth depressing portion 924 of the third flexible PCB 90, the fifteenth depressing portion 514a of the second rigid substrate 522a, and parts of the third trace layer 602a and of the fourth trace layer 702a corresponding to the seventh depressing portion 414 together form a second rigid portion 2002 of the rigid-flexible PCB 200. The eighth depressing portion 416 of the first rigid substrate 422, the third depressing portion 126 of the first flexible PCB 10, the tenth depressing portion 516 of the first rigid substrate 422a, and parts of the third trace layer 602a corresponding to the tenth depressing portion 516 together form a third rigid portion 2003 of the rigid-flexible PCB 200. The thirteenth depressing portion 926 of the third flexible PCB 90, the sixteenth depressing portion 516a of the second rigid substrate 522a, and parts of the fourth trace layer 702a corresponding to the thirteenth depressing portion 926 together form a fourth rigid portion 2004. The first exposed portion 120 of the first flexible PCB 10 forms a first flexible portion 2005 of the rigid-flexible PCB 200. The second exposed portion 220 of the second flexible PCB 20 forms a second flexible portion 2006 of the rigid-flexible PCB 200. The third exposed portion 920 of the third flexible PCB 90 forms a third flexible portion 2007 of the rigid-flexible PCB 200. The second flexible portion 2006 connects the first rigid portion 2001 to the second rigid portion 2002. The first flexible portion 2005 connects the first rigid portion 2001 to the third rigid portion 2003. The third flexible portion 2007 connects the first rigid portion 2001 to the fourth rigid portion 2004. The third rigid portion 2003 and the fourth rigid portion 2004 are spaced from the second rigid portion 2002.

The structure of the rigid-flexible substrate 200 is similar to the structure of the rigid-flexible substrate 100 except that the rigid-flexible substrate 200 further includes the third flexible PCB 90, and the second rigid substrate 522a further includes the sixteenth depressing portion 516a. The third flexible PCB 90 includes the eleventh depressing portion 922, the third exposed portion 920, and the thirteenth depressing portion 926 connected in series. The third flexible PCB 90 further includes the twelfth depressing portion 924 separated from the eleventh depressing portion 922, the third exposed portion 920, and the thirteenth depressing portion 926. Opposite sides of the eleventh depressing portion 922 are adhered to the fourth depressing portion 222 of the second flexible PCB 20 and the fourteen depressing portion 512a of the second rigid substrate 522a. Opposite sides of the twelfth depressing portion 924 are adhered to the fifth depressing portion 224 of the second flexible PCB 20 and the fifteenth depressing portion 514a of the second rigid substrate 522a. The third exposed portion 920 and the thirteenth depressing portion 926 are located between the fourteenth depressing portion 512a and the fifteenth depressing portion 514a. A length of the second exposed portion 220 is larger than a sum of the respective lengths of the third exposed portion 920 and of the thirteenth depressing portion 926. The fifth trace layer 908 is formed on a side of the third flexible PCB 90 away from the second flexible PCB 20. The sixteenth depressing portion 516a is laminated on the fifth trace layer 908 at the thirteen depressing portion 926. The third exposed portion 920 is exposed to form the third flexible portion 2007. The thirteenth depressing portion 926 includes the fourth trace layer 702a. The rigid-flexible PCB 200 further includes the third cover film 910 covering the fifth trace layer 908 on the third exposed portion 920.

The rigid-flexible PCB includes at least two flexible PCBs, and at least one of the rigid portions connected to at least one of the flexible PCBs, a flexible PCB being thus located on either side of two rigid portions. That is, the rigid-flexible PCB includes at least one rigid portion in the flexible portion. In this way, the area of the rigid portions at opposite ends of the rigid-flexible PCB can be reduced to make the rigid-flexible PCB more compact.

It will be understood that the above particular embodiments are shown and described by way of illustration only. The principles and the features of the present disclosure may be employed in various and numerous embodiments thereof without departing from the scope of the disclosure. The above-described embodiments illustrate the scope of the disclosure but do not restrict the scope of the disclosure.

What is claimed is:

1. A method for manufacturing a rigid-flexible printed circuit board (PCB), comprising:
providing a first flexible PCB, the first flexible PCB comprising a first exposed portion, a first depressing portion, a second depressing portion, a third depressing portion, and a first unwanted portion, the first depressing portion, the first exposed portion, the third depressing portion, the first unwanted portion, and the second depressing portion being arranged in sequence along a lengthwise direction of the first flexible PCB;
providing a second flexible PCB, the second flexible PCB comprising a fourth depressing portion corresponding to the first depressing portion, a fifth depressing portion corresponding to the second depressing portion and a second exposed portion arranged between the fourth depressing portion and the fifth fourth depressing portion;
adhering the first depressing portion to the fourth depressing portion, adhering the second depressing portion to the fifth depressing portion, and aligning the first exposed portion, the third depressing portion, and the first unwanted portion with the second exposed portion;
laminating a first semi-curable glue piece and a first copper foil layer on the first flexible PCB in sequence, laminating a second semi-curable glue piece and a second copper foil layer on the second flexible PCB in sequence, heating and pressing to solidifying the first curable glue piece and the second curable glue piece to obtain a first rigid substrate and a second rigid substrate;
selectively etching the first copper foil layer and the second copper foil layer to obtain a third trace layer and a fourth trace layer; and
removing the first rigid substrate and the first copper layer at the first exposed portion and the first unwanted portion, the first unwanted portion, the second rigid substrate and the second copper layer at the second exposed portion, to obtain the rigid-flexible PCB.

2. The method of claim 1, wherein the first flexible PCB further comprises a second unwanted portion at a peripheral of the first flexible PCB, the second flexible PCB further comprises a third unwanted portion at a peripheral of the second flexible PCB, the method further comprises a step of removing the second unwanted portion, the third unwanted portion, the first rigid substrate and the first copper foil layer corresponding to the second unwanted portion, and the second rigid substrate and the second copper foil layer corresponding to the third unwanted portion after the third trace layer and the fourth trace layer are formed.

3. The method of claim 2, further comprising covering a side of the first exposed portion away from the second flexible PCB with a first release film, and covering a side of the second exposed portion away from the first flexible PCB with a second release film.

4. The method of claim 3, wherein the first flexible PCB comprises long strip shaped a first pre-cut hole and a second pre-cut hole, the first pre-cut hole extends along a boundary between the first unwanted portion and the third depressing portion, the second per-cut hole extends along a boundary between the first unwanted portion and the second depressing portion, and two ends of either of the first pre-cut hole or the second pre-cut hole are adjacent to the second unwanted portion.

5. The method of claim 4, wherein the first semi-curable glue piece comprises long strip shaped a third pre-cut hole, a fourth pre-cut hole, a fifth pre-cut hole, and a sixth pre-cut hole, after the first flexible PCB, the first semi-curable glue piece, and the first copper foil layer are stacked together, the third pre-cut hole extends along a boundary between the first exposed portion and the first depressing portion, the fourth pre-cut hole extends along a boundary between the first exposed portion and the third depressing portion, the fifth pre-cut hole is parallel to and communicated with the first pre-cut hole, the sixth pre-cut hole is parallel to and communicated with the second pre-cut hole; the second semi-curable glue piece comprises long strip shaped a seventh pre-cut hole and a eighth pre-cut hole, after the second flexible PCB, the second semi-curable glue piece, and the second copper foil layer are stacked together, the seventh pre-cut hole extends along a boundary between the second exposed portion and the fourth depressing portion, the eighth pre-cut hole extends along a boundary between the second exposed portion and the fifth depressing portion.

6. The method of claim 4, wherein the first semi-curable glue piece comprises long strip shaped a third pre-cut hole, a fourth pre-cut hole, a fifth pre-cut hole, and a sixth pre-cut hole, after the first flexible PCB, the first semi-curable glue piece, and the first copper foil layer are stacked together, the third pre-cut hole extends along a boundary between the first exposed portion and the first depressing portion, the fourth pre-cut hole extends along a boundary between the first exposed portion and the third depressing portion, the fifth pre-cut hole is parallel to and communicated with the first pre-cut hole, the sixth pre-cut hole is parallel to and communicated with the second pre-cut hole; the second semi-curable glue piece comprises long strip shaped an eleventh pre-cut hole, a twelfth pre-cut hole, a thirteen pre-cut hole and a fourteen pre-cut hole, after the third flexible PCB, the second semi-curable glue piece, and the second copper foil layer are stacked together, the eleventh pre-cut hole extends along a boundary between the third exposed portion and the eleventh depressing portion, the twelfth pre-cut hole extends along a boundary between the third exposed portion and the thirteenth depressing portion, the thirteenth pre-cut hole is parallel to and communicated with the ninth pre-cut hole, the fourteenth pre-cut hole is parallel to and communicated with the tenth pre-cut hole.

\* \* \* \* \*